United States Patent
Carpenter et al.

(10) Patent No.: US 11,797,728 B2
(45) Date of Patent: Oct. 24, 2023

(54) AUTOMATING EXTRACTION OF MATERIAL MODEL COEFFICIENTS FOR SIMULATIONS

(71) Applicant: ANSYS, INC., Canonsburg, PA (US)

(72) Inventors: Vinay Kumar Carpenter, Pune (IN); Prem Andrade, Pune (IN); Ravindra Lahu Masal, Pune (IN)

(73) Assignee: ANSYS, INC., Canonsburg, PA (US)

( * ) Notice: Subject to any disclaimer, the term of this patent is extended or adjusted under 35 U.S.C. 154(b) by 520 days.

(21) Appl. No.: 15/929,389

(22) Filed: Apr. 30, 2020

(65) Prior Publication Data
US 2021/0342501 A1   Nov. 4, 2021

(51) Int. Cl.
*G06F 30/20* (2020.01)
*G06F 30/10* (2020.01)

(52) U.S. Cl.
CPC .............. *G06F 30/20* (2020.01); *G06F 30/10* (2020.01)

(58) Field of Classification Search
CPC .......... G06F 30/20; G06F 30/10; G06F 30/00; G06F 30/25; G06F 30/27; G06F 30/28; G06F 2110/00–2119/22
USPC .......................................................... 703/1
See application file for complete search history.

(56) References Cited

U.S. PATENT DOCUMENTS

| 11,347,911 | B2 * | 5/2022 | Witowski | G06F 30/23 |
| 2020/0210542 | A1 * | 7/2020 | Cojocaru | G06F 30/23 |
| 2021/0240896 | A1 * | 8/2021 | Ayyagari | G06F 30/3308 |

FOREIGN PATENT DOCUMENTS

CN    104614985 A  *  5/2015

OTHER PUBLICATIONS

Bouchenot et al. "A Reduced Order Constitutive Modeling Approach for a Material Subjected to Combined Cycle Fatigue" 2018 AIAA/ASCE/AHS/ASC Structures, Structural Dynamics, and Materials Conference (Year: 2018).*

* cited by examiner

*Primary Examiner* — Rehana Perveen
*Assistant Examiner* — Troy A Maust
(74) *Attorney, Agent, or Firm* — Womble Bond Dickinson (US) LLP

(57) ABSTRACT

Systems and methods for deriving material coefficient values from physical measurements of physical objects are described. These physical measurements can provide material test data. In one embodiment of a method described herein, the material test data can be used to calculate a first subset of material coefficients for use in one or more material models from material test data; the method can define a set of optimization parameters and define a set of relationships between a second subset of the material coefficients and the set of optimization parameters such that values of the material coefficients in the second subset of material coefficients can be calculated from the set of optimization parameters, wherein the first subset and the second subset include all of the material coefficients in the one or more material models and the set of optimization parameters have fewer parameters than a total number of coefficients in the first subset and the second subset; then the method can calculate optimum values of the optimization parameters to yield an optimum fit of the one or more models to the material test data, the optimum fit based on optimum material coefficients calculated from the calculated optimum values of the optimization parameters.

20 Claims, 20 Drawing Sheets

Essential Material Models for TMF (Thermo-Mechanical Fatigue)

- Hooke's law for elastic response $$\varepsilon_{ij} = \frac{1}{E}\left(\sigma_{ij} - \nu(\sigma_{kk}\delta_{ij} - \sigma_{ij})\right)$$

- Chaboche Kinematic Hardening with Static Recovery $$\alpha = \sum_{i=1}^{n}\alpha_i \quad \dot{\alpha}_i = \frac{2}{3}C_i\dot{\varepsilon}^{pl} - \gamma_i\dot{\varepsilon}^{pl}\alpha_i + \frac{1}{C_i}\frac{dC_i}{d\theta}\dot{\theta}\alpha_i - \frac{C_i}{M_i^{m_i}}\alpha_i^{m_i-1}\alpha_i$$

- Exponential Visco hardening for rate dependence $$\dot{\varepsilon}_{pl} = \sum_{i=1}^{N}\left(\frac{\sigma - \bar{\sigma}_0}{K_i}\right)^{1/n_i} \quad \bar{\sigma}_o = \text{Total hardened stress}$$

$$E, \nu, \sigma_Y, C_1, \gamma_1, C_2, \gamma_2, C_3, \gamma_3,$$
$$m_1, M_1, m_2, M_2, m_3, M_3, n_1, K_1, n_2, K_2$$

Total of 19 unknowns

FIG. 6A $$\varepsilon_{ij} = \frac{1}{E}\left(\sigma_{ij} - \nu(\sigma_{kk}\delta_{ij} - \sigma_{ij})\right) \quad \Big\} \begin{array}{l} \textit{Young's Modulus - E} \\ \textit{Poisson's Ration - } \nu \end{array}$$

$$\alpha = \sum_{i=1}^{n} \alpha_i$$

$$\dot{\alpha}_i = \frac{2}{3} C_i \dot{\xi}_i^{pl} - \gamma_i \dot{\xi}_i^{pl} \alpha_i + \frac{1}{C_i} \frac{dC_i}{d\theta} \dot{\theta} \alpha_i - \frac{C_i}{M_i^{m_i}} \bar{\alpha}_i^{m_i-1} \alpha_i \quad \left\} \begin{array}{l} \textit{Yield Stress - } \sigma_Y \\ \textit{Chaboche (non-linear Kinematic Hardening)} \\ \textit{Coefficients - } C_1, \gamma_1, C_2, \gamma_2, C_3, \gamma_3 \\ \textit{Kinematic Static Recovery (KSR)} \\ \textit{Coefficients - } m_1, M_1, m_2, M_2, m_3, M_3 \end{array}\right.$$

$$\dot{\hat{\varepsilon}}_{pl} = \sum_{i=1}^{N} \left(\frac{\sigma - \bar{\sigma}_0}{K_i}\right)^{1/n_i} \quad \Big\} \begin{array}{l} \textit{Exponential Visco-Hardening} \\ \textit{Coefficients - } n_1, K_1, n_2, K_2 \end{array}$$

FIG. 6B

- Available information: $P_1, P_2, P_3$ and experimental information
- Assume poisson's ratio $v = 0.3$ and $\gamma_3 \cong 0.0$
- Calculate $E, \sigma_y, C_3$ from experimental information High $\dot{\varepsilon}$

- Available information: $P_1, P_2, P_3$ and experimental information, material coefficients $E, v, \sigma_Y, C_3, \gamma_3$
- Establish interdependence of material coefficients
  - $P_1 = E/C_1$
  - $P_2 = C_1/C_2$ $\Big\}$ $P_1$ and $P_2$ are used to calculate $C_1$ and $C_2$
  - $\alpha_{saturated} = -0.9\sigma_{S1} - \sigma_Y$ } fixing magnitude of Kinematic hardening
  - $\dfrac{C_1}{\gamma_1} + \dfrac{C_2}{\gamma_2} + \dfrac{C_3}{\gamma_3} = \alpha_{saturated}$
- Calculate $\gamma_1$ and $\gamma_2$ by assuming fixed split (70:30) between $\dfrac{C_1}{\gamma_1}$ and $\dfrac{C_2}{\gamma_2}$

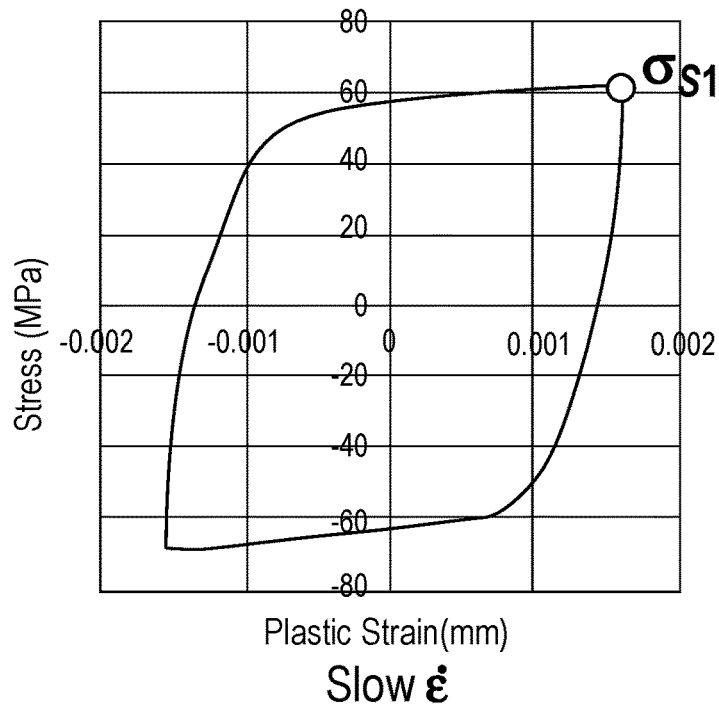

Plastic Strain(mm)

Slow $\dot{\varepsilon}$

---

10 *unknown mat coefficients*
$m_1, M_1, m_2, M_2, m_3, M_3, n_1, K_1, n_2, K_2$

---

9 *known mat coefficients* $E, v, \sigma_Y,$
$C_1, \gamma_1, C_2, \gamma_2, C_3, \gamma_3$

FIG. 7C

- Available information: $P_1, P_2, P_3$ and experimental information, material coefficients $E$, $v$, $\sigma_y$, $C_1$, $\gamma_1$, $C_2$, $\gamma_2$, $C_3$, $\gamma_3$

- Calculate $n_1$, $K_1$, $n_2$, and $K_2$ assuming no KSR effect at this stage. Will be refined later.

High $\dot{\varepsilon}$

Viscous Stress = $\sigma_{H1} - (\alpha_{saturated} + \sigma_y)$

- Available information: $P_1, P_2, P_3$ and experimental information, material coefficients $E$, $v$, $\sigma_y$, $C_1$, $\gamma_1$, $C_2$, $\gamma_2$, $C_3$, $\gamma_3$, $n_1$, $K_1$, $n_2$, $K_2$, $m_1$, $M_1$, $m_2$, $M_2$, $m_3$, $M_3$
- Initial EVH ($n_1$, $K_1$, $n_2$, and $K_2$) calculation is done without considering KSR.
- Due to KSR effects we notice lower peak stresses: Need to refine EVH coefficients to match the peak stresses with experiments
- Calculate offsets due to stress fall, add them to peak stresses from experiments and recalculate EVH terms

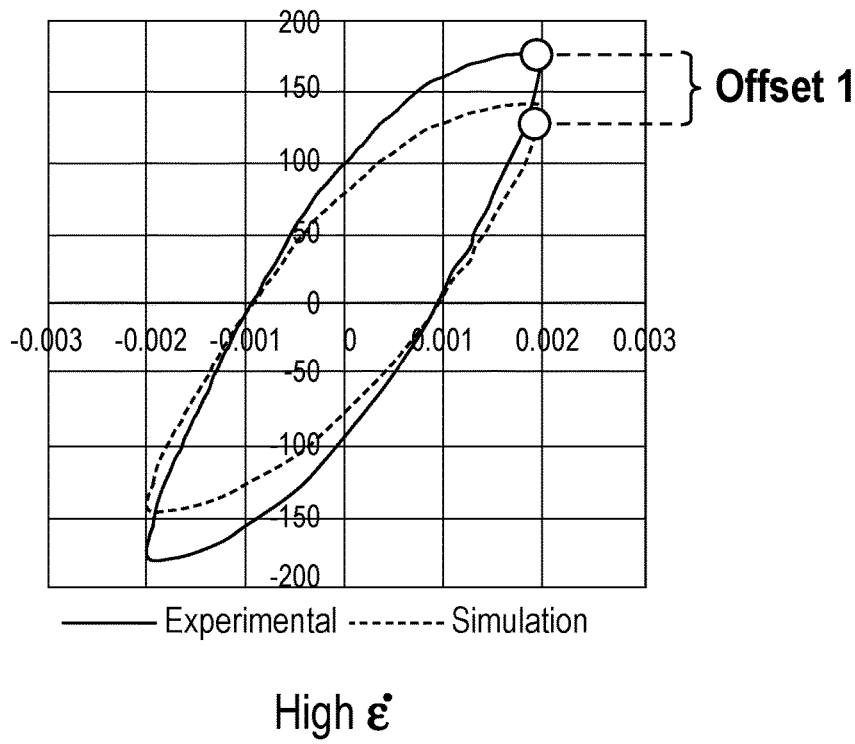

High $\dot{\varepsilon}$

FIG. 7E

AUTOMATING EXTRACTION OF MATERIAL MODEL COEFFICIENTS FOR SIMULATIONS

BACKGROUND

Simulations and other computations about material properties, such as simulations of thermo-mechanical fatigue (TMF), often rely upon knowing a large set of material coefficients that are used in mathematical models which describe properties of a material, such as a new metal alloy. In the case of TMF testing, material engineers currently test the material in a series of Low Cycle Fatigue (LCF) tests to produce experimental data that is usually depicted in graphs showing stress (on the y axis) relative to strain (on the x axis) for the tested material. Using this experimental data, material engineers attempt to extract the large set of material coefficients (e.g. 19 unknown values at a given temperature when a combination of Hooke's Law, Chaboche kinematic hardening, Kinematic Static Recovery (KSR) and Exponential Visco-hardening material models are used) from the experimental data. Once extracted, these coefficients can be used in certain models that describe properties or behaviors of the material. This extraction often uses manual trials and plotting or attempts at optimization using optimization software that attempts to optimize (e.g., reach a solution for each of the coefficients) over all of the large set of coefficients (e.g. optimize all 19 unknown values). These optimizations often do not work (because, e.g., there are too many unknowns), and it can take a team of engineers and consultants 8 to 12 weeks to derive material coefficients for one alloy before simulations of TMF can be performed.

SUMMARY OF THE DESCRIPTION

The embodiments and aspects described herein can create (e.g., define) and store a set of "optimization variables" and create (e.g., define) and store a relationship between those optimization variables and all of the unknown coefficients so that the unknown coefficients can be calculated from the optimization variables. The optimization variables can then be used to optimize a solution by using the optimization variables, instead of using all of the unknown coefficients, in an optimization algorithm; in one implementation, 3 optimization variables can be sufficient to allow efficient and quick optimization of the optimization variables which can then be used to calculate all of the material coefficients (using the created relationship). In one embodiment, the optimization variables can be processed by optimization software (e.g., Ansys's DesignXplorer) to generate different curves using the material models (e.g. a Chaboche model) and these curves can be compared to the experimental data to calculate errors (such as errors at only certain points on the curve) between the generated curves and the experimental data. If the errors are too large, the optimization software selects a new set of values for optimization variables (e.g. a new set of $P_1$, $P_2$, and $P_3$ optimization variables) and calculates new material coefficients (e.g., based on the new set of $P_1$, $P_2$, and $P_3$) and then generates new curves (based on the calculated new material coefficients) to be compared with the experimental data. This process repeats until the comparison produces errors below a desired error value which can be used to indicate that optimization has been completed. At that point, the calculated material coefficients can be used in TMF simulations and in other calculations.

A method according to one embodiment can use the following operations: storing material test data that has been collected from a set of one or more physical measurements; storing a set of optimization parameters (e.g., optimization variables) and storing a set of relationships between a set of material coefficients used in one or more material models and the set of optimization parameters such that values of the material coefficients in at least a portion of the set of material coefficients can be calculated from the set of optimization parameters, where the set of optimization parameters have fewer parameters (e.g., fewer variables) than a total number of coefficients in the set of material coefficients; and calculating optimum values of the optimization parameters to yield an optimum fit of the one or more material models to the material test data, the optimum fit based on optimum material coefficients calculated from the calculated optimum values of the optimization parameters. The optimum fit can be a near optimum fit rather than a perfectly optimized solution by using a threshold value (which can define a desired error level) to determine whether the fit is close enough (based upon the threshold value) to a perfectly optimized solution to be considered an optimum fit. In one embodiment, the set of material coefficients comprises a first subset of material coefficients and a second subset of material coefficients, and the second subset of material coefficients is the portion of the set of material coefficients that is calculated from the set of optimization parameters. The first subset of material coefficients can be calculated directly from the stored material test data before calculating the optimum values of the optimization parameters in one embodiment. In one embodiment, the method can further include an operation that modifies some values in the second subset to apply a second material model so that the calculated optimum values are based upon two material models and thus the material coefficients are also based on the two material models.

In one embodiment, the method can further include the operation of: performing one or more simulations of a simulated physical object that contains one or more materials associated with the calculated optimum material coefficients, where the calculated optimum material coefficients are used in the one or more simulations to determine the behavior of the one or more materials in the simulation of the physical object that contains or includes the one or more materials. In one embodiment, the simulations can provide one or more results that indicate one or more of: a performance of the physical object; failure data about the physical object; thermo-mechanical fatigue data about the physical object; or data specifying an estimated useful life of the physical object. In one embodiment, after the one or more simulations, the method can further include the operation of: revising the design of the physical object based upon the one or more results of the one or more simulations, and this revised design can be further simulated or tested or prepared for fabrication or manufacture.

In one embodiment, a method can use specified or default ranges of possible values for each of the optimization parameters in the set of optimization parameters to allow the set of optimization parameters to work for a variety of different materials; for example, a range of possible numbers (e.g., 0 to 1000) can be specified (for example as default ranges) for each of the optimization parameters as a constraint in the optimization algorithm. In one embodiment, the optimization parameters can be programmed such that the default ranges work well for most of the metal alloys. However, the users, in one embodiment, do have the freedom to change the range of these optimization parameters if at all needed. In one embodiment, a method can calculate the optimum values of the set of optimization parameters using an iterative optimization algorithm in a solver that approaches the optimum fit by attempting to optimize a solution by iteratively reducing measured error(s) between a plurality of points on the simulated curves derived from the calculated set of coefficients and the corresponding points on the experimental data. In one embodiment, the material test data can include low cycle fatigue (LCF) test data for a physical object and the one or more material models can comprise one or more of: a Chaboche Kinematic Hardening model; a Kinematic Static Recovery (KSR) model and an Exponential Visco Hardening (Viscoplasticity) model. In one embodiment, the optimum fit can be based on errors computed at only selected points of the material test data relative to corresponding points on the simulated curves.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in nonvolatile memory, such as flash memory, or dynamic random access memory (DRAM) which is volatile or other forms of memory.

The above summary does not include an exhaustive list of all embodiments are aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements.

FIG. 6A shows an example of material models that can be used for simulating thermo-mechanical fatigue.

FIG. 6B shows a description of all of the material coefficients and the material models which use them.

FIG. 7C shows how operation 403 in FIG. 7A can be performed to calculate some additional material coefficients.

DETAILED DESCRIPTION

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

Figure 1:
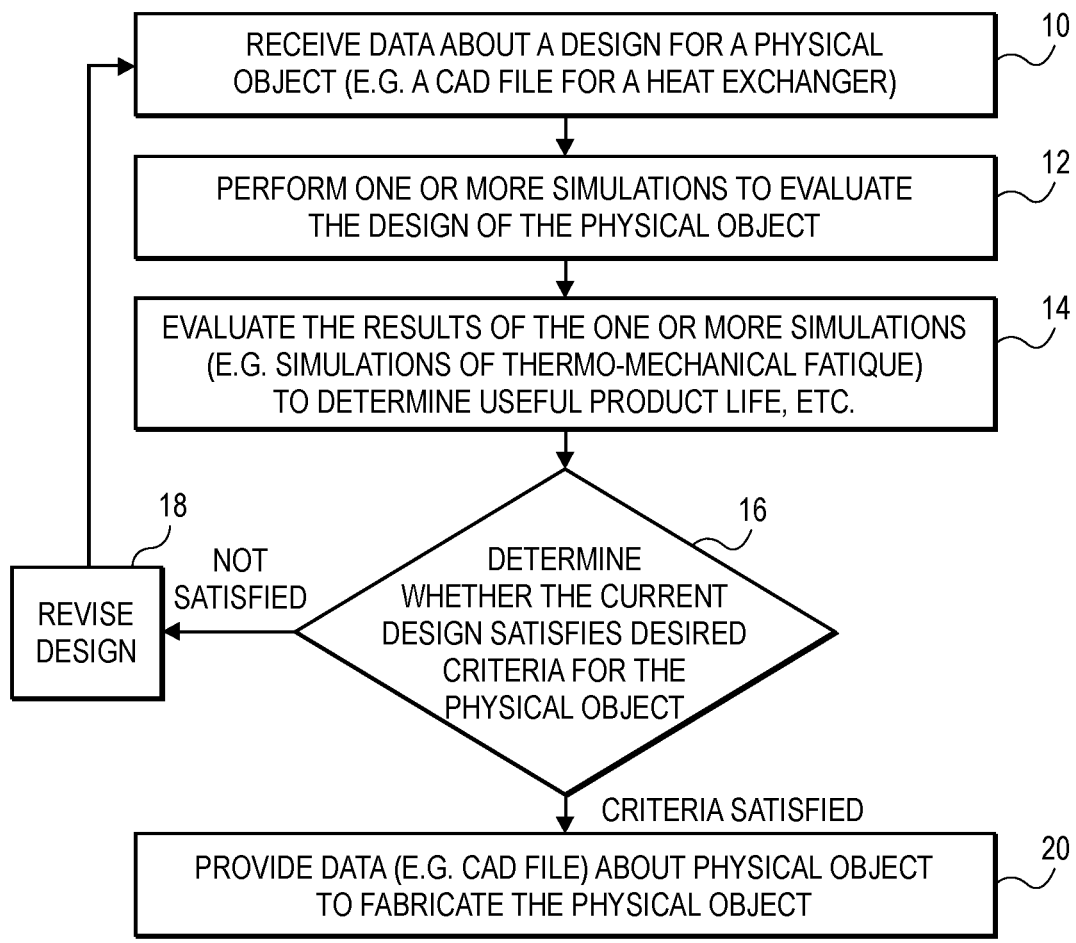
FIG. 1 shows a method which can be used according to one or more embodiments described herein to design and fabricate a physical object such as a component in or attached to an airplane wing.

The process of designing physical objects, such as heat exchangers, turbochargers, or portions of a jet engine, often involves the use of computer simulations to evaluate the design of the physical object prior to the manufacture or fabrication of the physical object. The simulations allow designers to test out various alternative designs and evaluate them based upon the results of the simulations. The use of such simulations can improve the performance of the physical object while also decreasing the cost of the design process because the alternative designs can be tested and evaluated using the computer simulations without manufacturing or fabricating the physical object. FIG. 1 shows an example of a method which can use such computer simulations in the process of designing a physical object. In operation 10, a data processing system, such as a computer, can receive data about a design for a physical object; for example, the data can be a computer aided design (CAD) file that describes the physical object using techniques known in the art. The data can be created in CAD software on a data processing system, and the data can include information about the materials used to fabricate the physical object as well as sizes of different parts of the physical object, the shape of the physical object, etc. Then in operation 12, the data processing system can perform one or more simulations to evaluate the design of the physical object. For example, in one embodiment the simulations can be thermal-mechanical fatigue (TMF) simulations to evaluate how the materials behave under high temperatures and high stress, where the temperatures can fluctuate over time and the stresses can fluctuate over time as a result of the normal operation of the physical object in, for example, a heat exchanger or a turbocharger or a jet engine. Then in operation 14, one or more designers can evaluate the results of the one or more simulations to determine information about the performance and useful product lifetime of the physical object based upon the results from the one or more simulations. Then in operation 16, the designers can determine whether the current design satisfies desired criteria for the physical object. For example, if the simulations show that the product will fail in one year instead of the desired lifetime of three years, the designer will conclude that the criteria has not been satisfied and will revise the design in operation 18 as shown in FIG. 1. On the other hand, if the criteria are satisfied, the designer can conclude the design process and provide data, such as a CAD file, about the physical object to allow the physical object to be fabricated or manufactured in operation 20. If the criteria are not satisfied as determined in operation 16, the designer can revise the design in operation 18 (for example, by changing sizes or shapes of parts in the physical object or changing the composition of material(s) in the object, etc.) and repeat the process by performing additional further simulations to evaluate the redesigned physical object. This can be repeated until the desired criteria are achieved for the physical object, and may require the designer change the design in terms of the materials used, shapes and sizes of components in the physical object, and other parameters that describe how the physical object will be fabricated or otherwise produced.

Figure 2:
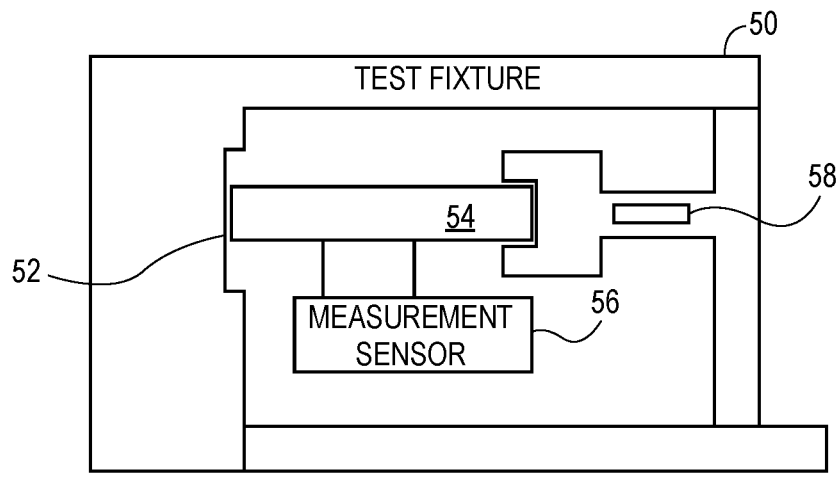
FIG. 2 shows an example of a test fixture that can be used to generate experimental test data (e.g., LCF test data) about a material in a physical object under test in the test fixture. The physical object can, for example, be a portion of the component that is in or attached to the airplane wing.

The simulations performed in the method shown in FIG. 1 can be simulations of the behavior of a set of one or more materials in the physical object such as a heat exchanger or a turbocharger or portions of a jet engine. These simulations can be TMF simulations that attempt to determine how the materials behave over repeated cycles of thermal heating and cooling and over repeated cycles of mechanical loading (stress and strain). These TMF simulations often overlay the cycles in time so that the physical object in the simulation is subjected to both heating and cooling and also mechanical loading at the same time. These TMF simulations can use models of TMF behavior that is based on experimental tests or data on the material in a TMF test fixture such as the TMF test fixture shown in FIG. 2. These TMF test fixtures are known in the art and are available from several companies. These test fixtures can characterize a material's response to the cyclic mechanical loading, such as a strain that cycles between pulling and pushing over time, with fluctuating, cyclic temperatures (cycling between heating and cooling over time). These test fixtures are often used to test materials for turbochargers, heat exchangers, jet engines, etc. The test fixture 50 in FIG. 2 can implement a strain controlled TMF testing that applies a strain, such as a push or a pull, on the object 54 under test and measures the stress at the corresponding applied strain in one embodiment. The test fixture 50 includes one or more grips, such as a grip 52, to hold the object 54 which contains a material being tested, such as a new metal alloy. The test fixture can include one or more measurement sensors such as measurement sensors 56 and 58. For example, measurement sensor 58 can measure stress as a controlled strain (pulling or pushing) is applied to the object 54. In another embodiment, the TMF test fixture can control stress and measure strain. The test fixture can apply different cycles at different rates to produce experimental test data that can be plotted on one or more graphs. These different cycles and different rates are known in the art. These plotted graphs can show how stress varies over time as strain changes, and the rate of change of strain can be at different rates. For example, there can be TMF tests done, in test fixture 50, at a high rate of change of strain over time (at the same or different temperatures over time), and another set of tests can be TMF tests done at a medium rate of change of strain over time, and another set of tests can be TMF tests done at a slow rate of change of strain over time, where the high, medium, and slow rates are relative to each other. A fourth set of tests can be TMF tests done with a strain that is held for a period of time during a cycle as temperature is held at a high temperature. FIGS. 3A, 3B, 3C, and 3D show examples of these four different sets of tests.

Figure 3B:
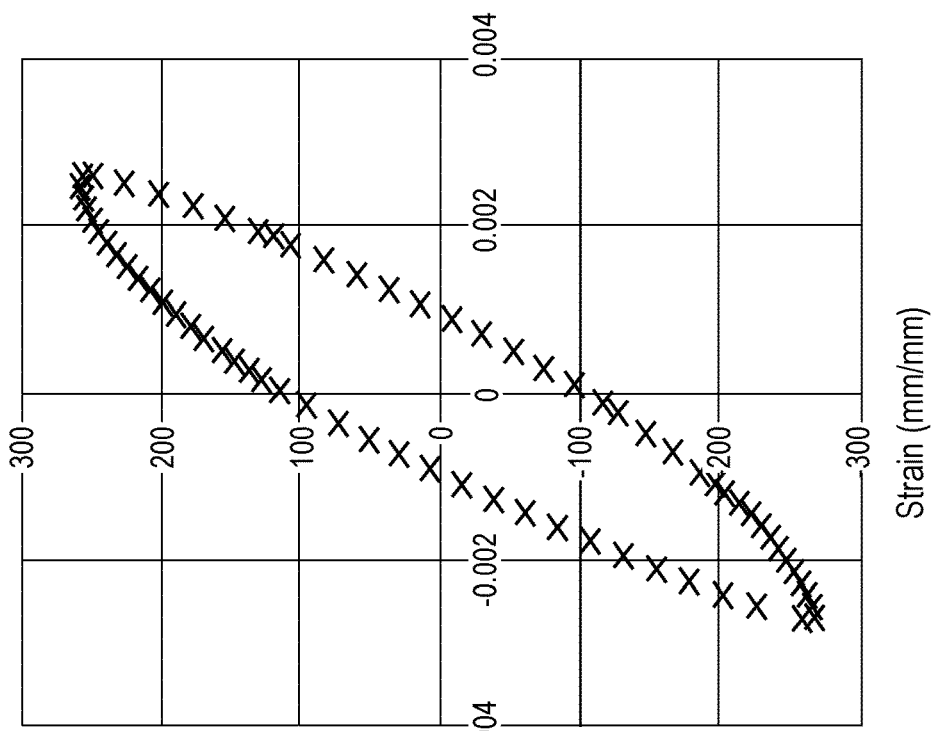
FIGS. 3A, 3B, 3C, and 3D show experimental data, from LCF tests, on graphs of stress relative to strain.
Figure 3A:
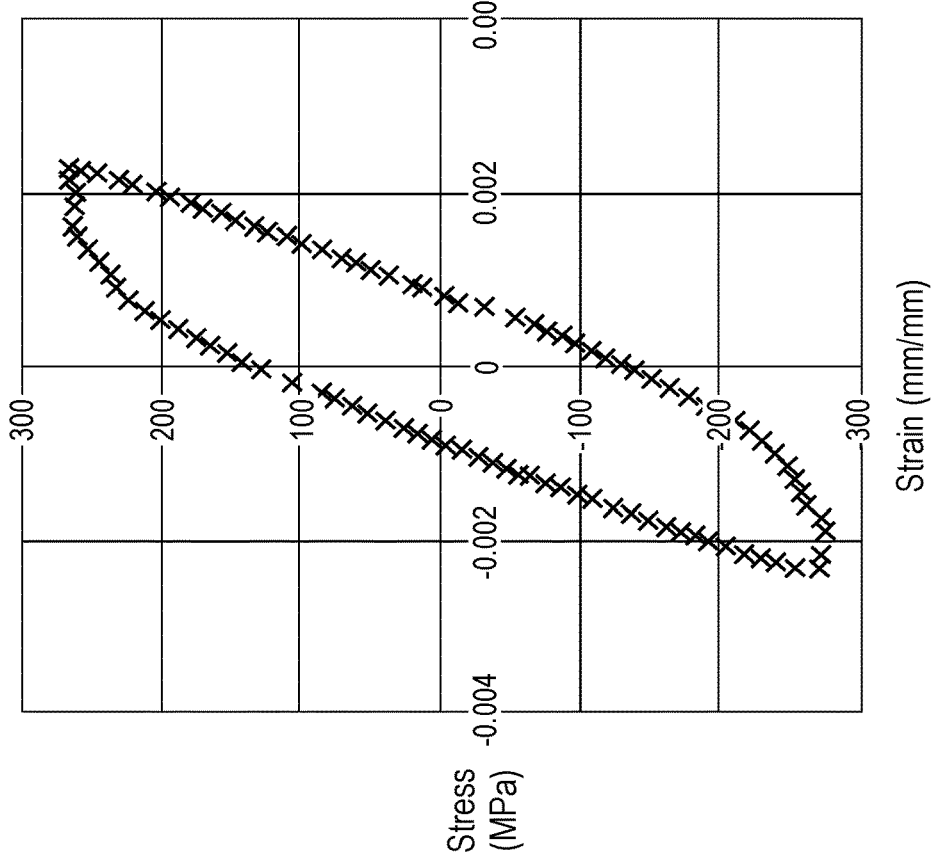
Figure 3D:
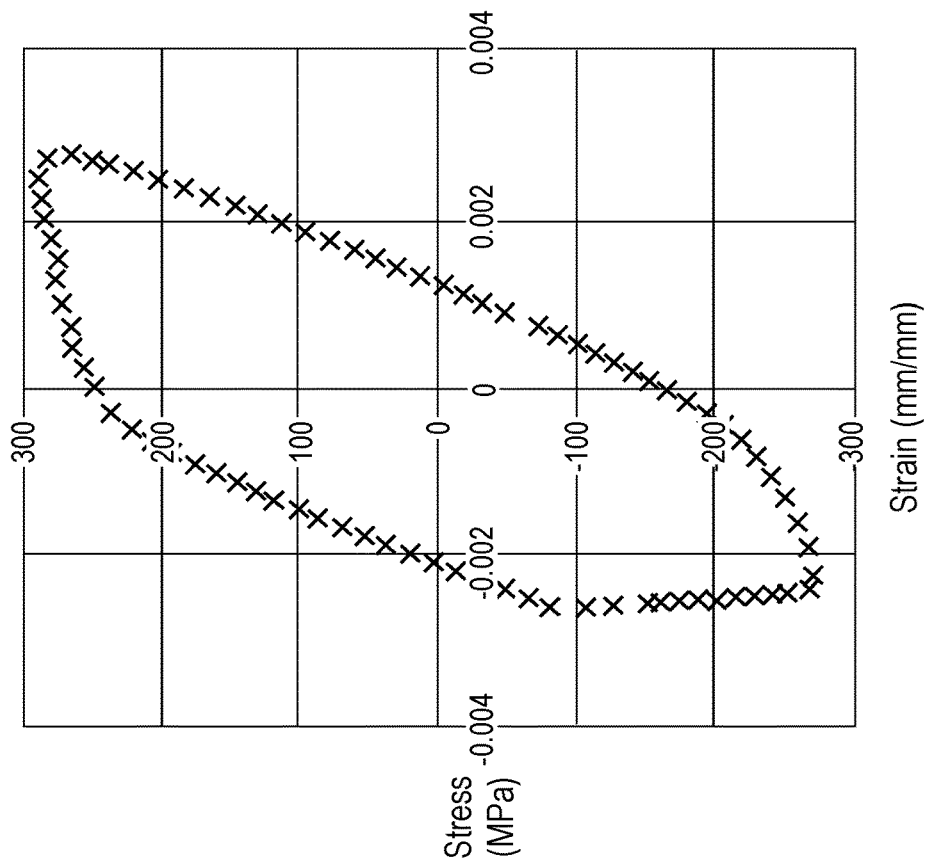
Figure 3C:
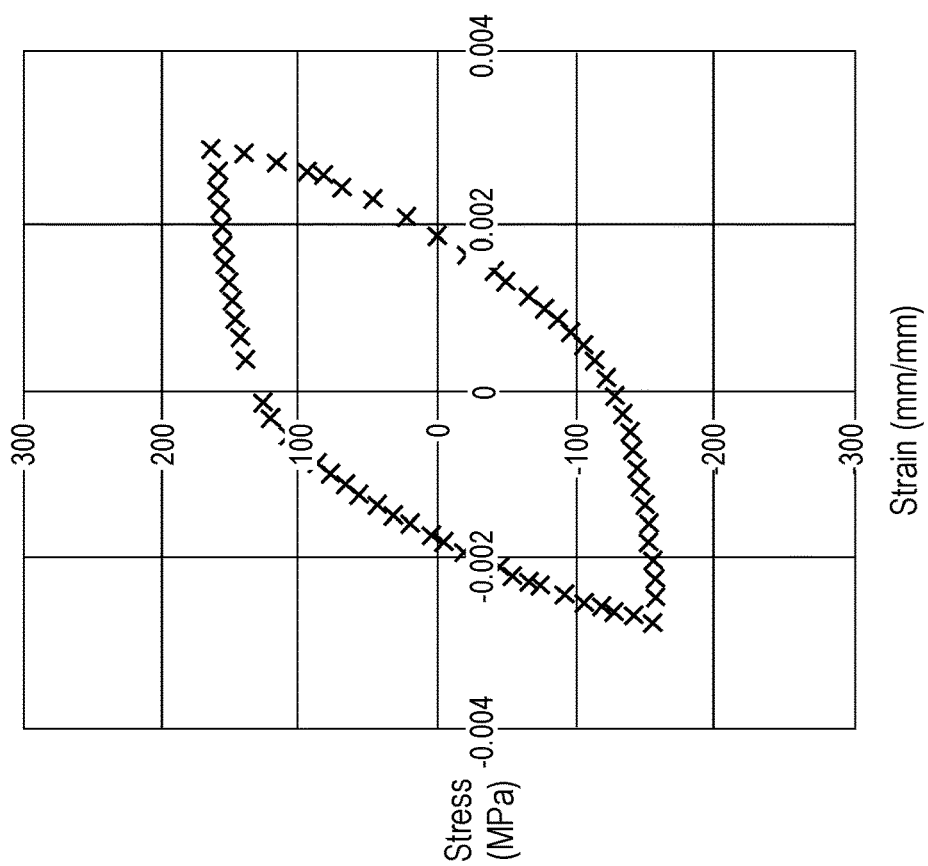

FIG. 3A shows an example of test data from a set of TMF tests using a high rate of change of strain; the data in FIG. 3A shows how stress (on the Y axis) changes over time as a function of controlled strain (on the X axis) that changes at a high rate over time. FIG. 3B shows an example of test data from a set of TMF tests using a medium rate of change of strain, and this data in FIG. 3B shows how stress changes over time as a function of controlled strain that changes at a medium rate over time. FIG. 3C shows an example of test data from a set of TMF tests using a slow rate of change of strain, and the data shown in FIG. 3C shows how stress changes over time as a function of controlled strain that changes at a slow rate over time. FIG. 3D shows an example of test data from a set of TMF tests using a dwell withhold and compression technique that is known in the art. These graphs can be used to extract material coefficients for the material tested in the TMF tests by using the one or more embodiments described herein. For example, the methods shown in FIG. 4 or 5 or 7A can be used to extract the material coefficients for the material that was tested without requiring an optimization solution over all of the material coefficients used in one or more material models that can be used in the simulations, such as the simulations in operation 12 shown in FIG. 1.

A general method according to one embodiment will now be described while referring to FIG. 4. In operation 151 in FIG. 4, a data processing system can store material test data that is been collected from a set of one or more physical measurements (such as, for example, TMF test data). For example, the test data stored in operation 151 can be data collected from a set of TMF tests such as the data represented in the graphs of FIGS. 3A, 3B, 3C, and 3D. This material test data can reveal properties of the material that was tested. In operation 153, a data processing system can define and store a set of optimization parameters and define and store a set of relationships between a set of material coefficients, used in one or more material models, and the set of optimization parameters such that values of the material coefficients in at least a portion of the set of material coefficients can be calculated from the set of optimization parameters. In one embodiment, the set of optimization parameters can be a set of N variables and the set of material coefficients can be a set of M material coefficients, where N is less than M. For example, in one embodiment N can be three and M can be 19. These optimization parameters can be considered to be optimization variables which will be used in the optimization algorithm to optimize a solution, and these optimization parameters are used in the optimization algorithm rather than using the set of M material coefficients in the optimization algorithm. Specific examples of optimization parameters and a set of relationships between material coefficients and the set of optimization parameters are provided below in conjunction with the methods shown in FIGS. 5 and 7A. In operation 155, the data processing system can calculate optimal values of the set of optimization parameters to yield an optimum fit of the one or more material models to the material test data. This optimum fit can be based on optimum material coefficients calculated from the calculated optimum values of the optimization parameters. Specific examples of the calculation of optimum values are provided below in conjunction with the methods shown in FIGS. 5 and 7A. In one embodiment, a conventional optimization algorithm, such as an algorithm provided by DesignXplorer from ANSYS Inc. of Canonsburg Pa., can be used to calculate the optimum values of the set of optimization parameters. In one embodiment, the optimization may be an iterative optimization in which a series of optimization parameters are computed repeatedly over time as the optimization solution converges to optimum values of the optimization parameters. The optimum values can be based upon a desired error level, such as a value of zero. In one embodiment, the optimum values need not exactly provide the desired error level but rather may provide an error level that is within a threshold value of the desired error level. In another embodiment, the optimization may be performed by an optimization solver which can directly solve the optimization without requiring multiple iterations. Once operation 155 has calculated the optimum values of the set of optimization parameters, the resulting optimum material coefficients can be calculated from those optimum values of the set of optimization parameters and then used in one or more simulations of a physical object in operation 157. For example, operation 157 can represent operation 12 shown in FIG. 1; thus, the calculated optimum material coefficients derived from operation 155 can be used in the method shown in FIG. 1 to perform the one or more simulations in operation 12 during the design process for a physical object.

Figure 5:
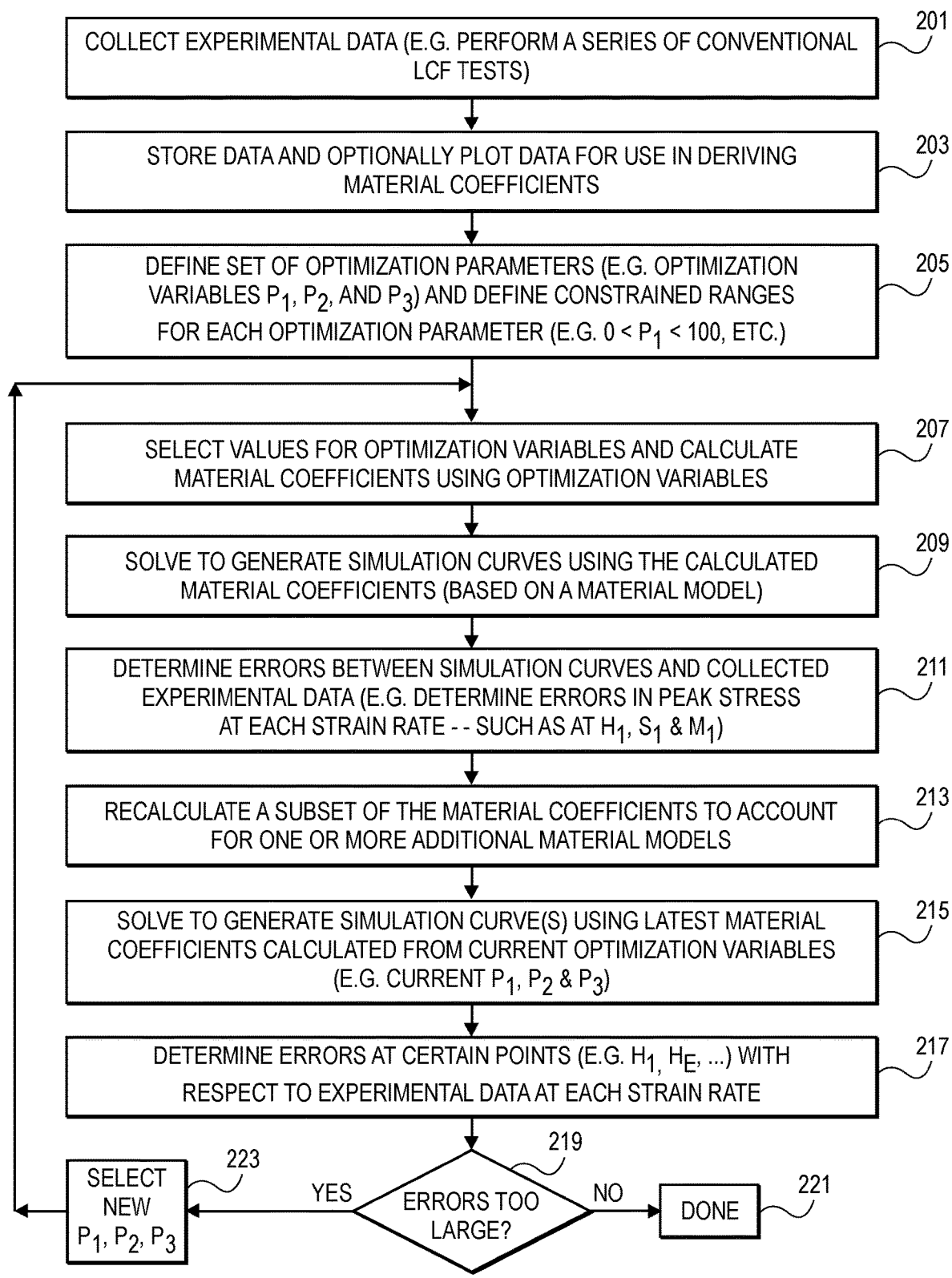
FIG. 5 is a flowchart that shows a detailed method according to one embodiment.

FIG. 5 shows a more specific method according to one embodiment to derive material coefficients for use in a material model or a set of material models. In operation 201 of FIG. 5, a data processing system can receive or collect experimental data such as material test data from a series of conventional LCF tests; FIGS. 3A, 3B, 3C, and 3D show examples of such experimental data which can be derived from TMF testing in a TMF test fixture. In operation 203, the experimental data can be stored and optionally plotted for use in deriving material coefficients in the method shown in FIG. 5. In operation 205, the data processing system can define a set of optimization parameters, such as optimization variables P1, P2 and P3. In one embodiment, the data processing system can use a stored representation of the set of optimization parameters which had previously been defined by a software developer and stored in software that can perform the method shown in FIG. 5. In one embodiment, the optimization parameters can each be constrained to have valid values only within a specified range of values. For example, P1 may be constrained to be valid only within a range of values of less than 100 and more than zero. These constrained ranges can be selected to ensure that the optimization parameters can work across a variety of different materials and thus can be considered to be independent of the material being tested in the TMF testing. The method can then continue in operation 207. In operation 207, the data processing system can select an initial set of values for the optimization variables and calculate material coefficients using the initial selected values for the optimization variables. Then in operation 209, the data processing system can solve the material models using techniques known in the art to generate simulation curves using the calculated material coefficients which were calculated in operation 207. The generation of the simulation curves can be based on one or more material models which use the calculated material coefficients. These generated simulation curves can then be used in operation 211 to determine the errors between the simulation curves which were generated in operation 209 and the collected experimental data which was obtained in operation 201. In one embodiment, operation 211 can measure the errors at peak stress points at each strain rate, such as the H1, S1 and M1 points; a specific example of the use of specific points to determine errors is provided further below in conjunction with the method shown in FIG. 7A. The use of specific points to measure errors can reduce the amount of computations required in the method shown in FIG. 5 and can also target the shape of the test curves to better represent the shape of the test curves by using specific discrete points on the test curves. Thus only these errors at the specific discrete points can be minimized in one embodiment to better represent the shape of the test curves. Following the determination of errors in operation 211, operation 213 can be performed to recalculate a subset of the material coefficients to account for one or more additional material models. For example, in one embodiment, a subset of the material coefficients can be recalculated as described below in conjunction with operation 411 shown in FIG. 7A in order to take into account at least one more material model. Then in operation 215, the data processing system can solve to generate simulation curves using the latest material coefficients calculated from the current optimization variables. Operation 215 is similar to operation 209 and generates the simulation curves which can then be compared to the curves in the test data. The comparison can be performed in operation 217 where the errors are determined, in one embodiment, at only certain points along the curves in the test data relative to the simulation curves generated in operation 215. Then the errors can be evaluated in operation 219 by comparing the errors to a desired error level; in one embodiment, a threshold value can be used in this comparison to determine whether or not the errors are within a threshold value of a desired error level which may be zero or a small number. If operation 219 determines the errors are within a threshold value of the desired error level, processing can be completed as indicated in operation 221. On the other hand, if the errors are too large (the errors are not within a threshold value of the desired error level), then processing proceeds to operation 223. In operation 223, the data processing system selects a new set of optimization variables, such as a new set of values for P1, P2, and P3. After the selection of a new set of optimization variables, processing reverts back to operation 207 to continue to attempt to determine an optimum set of optimization variables based upon the error levels calculated in operation 217. The method can continue repeatedly over time by cycling through operations 207, 209, 211, 213, 215, 217, 219, and 223 until optimum values for the optimization variables have been determined. The method shown in FIG. 5 can provide a computationally efficient method to fit the simulation curves to the curves of the test data by not requiring optimization of all material coefficients together; moreover, the method shown in FIG. 5 can use multiple different material models simultaneously in the optimization process, and the material coefficients can be calculated automatically without requiring manual efforts by the designer. Moreover, relative to conventional techniques, the method can be performed in less than a few hours for a particular temperature as opposed to several weeks to characterize the material for a single temperature. Further, the method shown in FIG. 5 can consistently generate in one embodiment coefficients across different temperatures while conventional manual trials normally lead to arbitrary variation of coefficients across temperatures. The method shown in FIG. 5 can be considered to compress many material coefficients into a fewer number of optimization variables. In one embodiment, the method shown in FIG. 5 can be used with the three material models for thermo-mechanical fatigue shown in FIGS. 6A and 6B. The material models shown in FIGS. 6A and 6B can also be used with the method shown in FIG. 7A.

Figure 4:
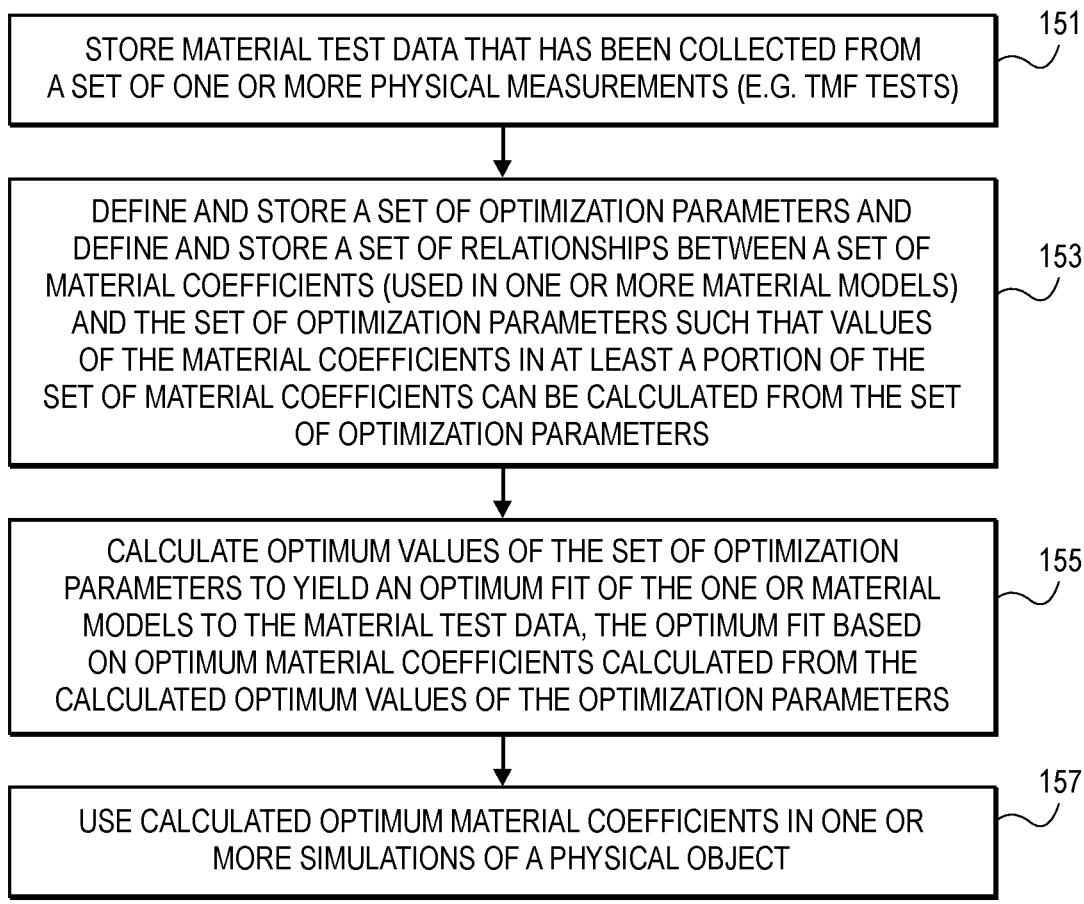
FIG. 4 is a flowchart that shows a general method according to one embodiment.
Figure 7A:
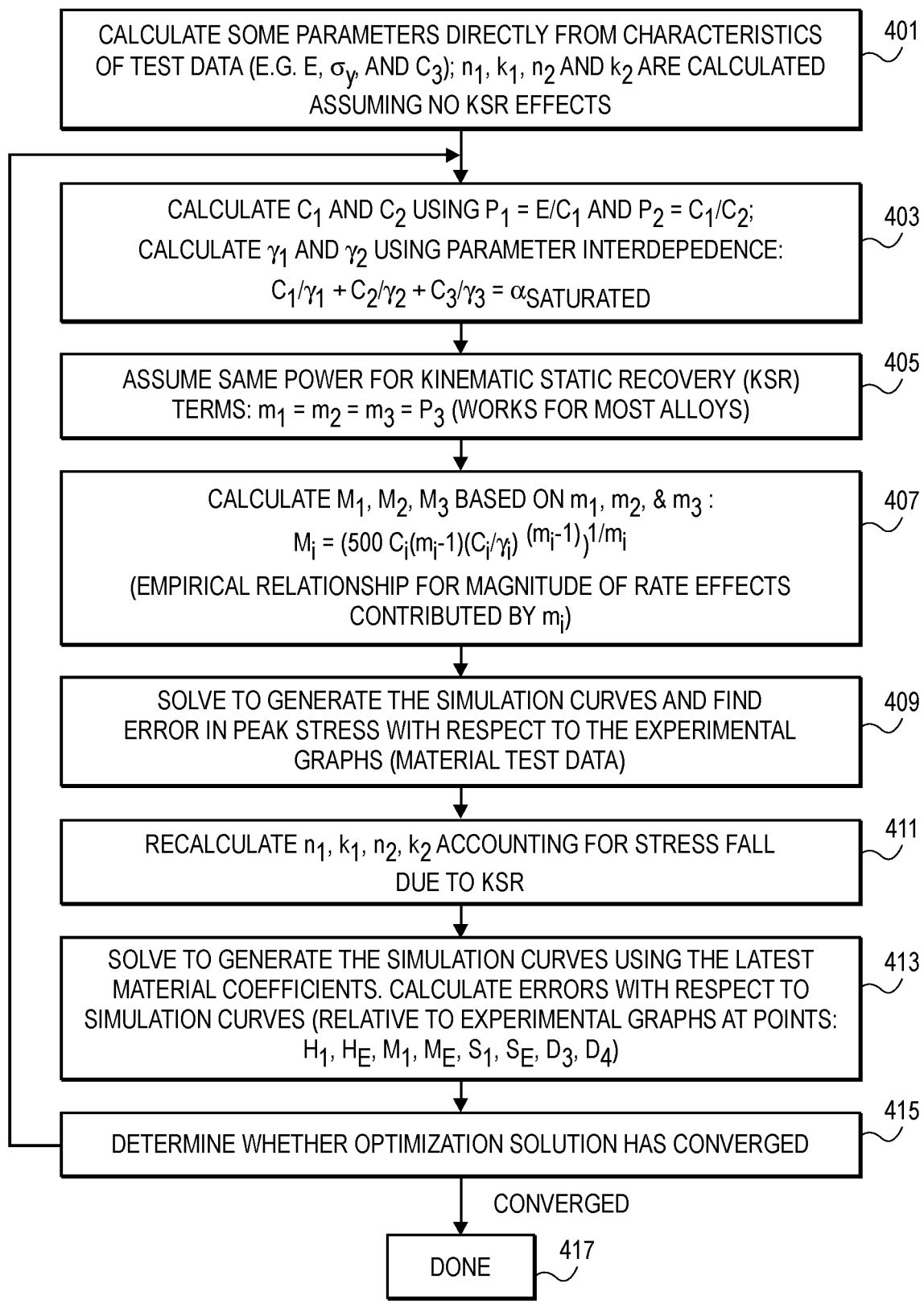
FIG. 7A is a flowchart that shows a particular method for a set of TMF models shown in FIGS. 6A and 6B.
Figure 7B:
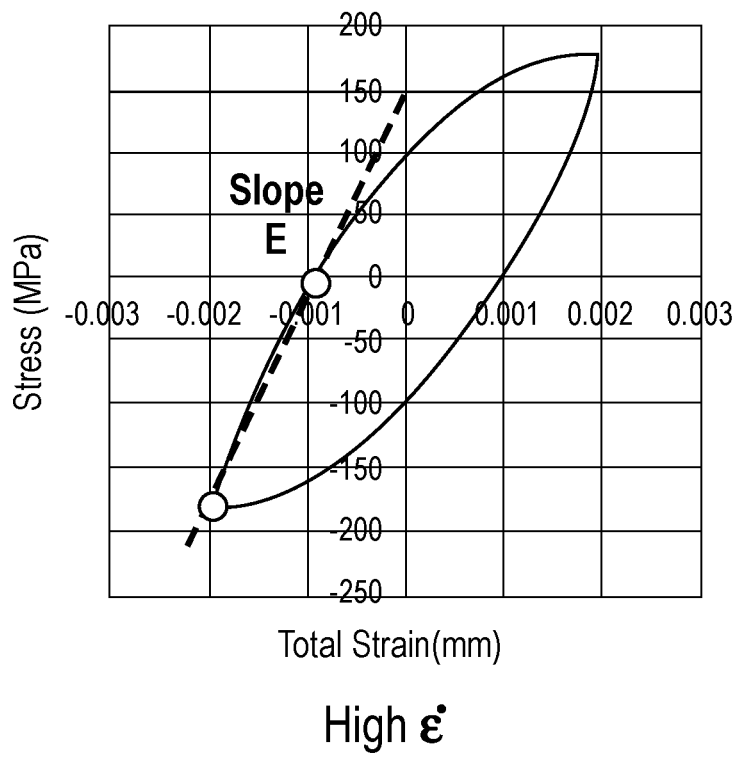
FIG. 7B (two sheets) show how operation 401 in FIG. 7A can be performed to calculate some of the material coefficients directly from the test data before attempting to optimize the optimization variables P1, P2 and P3.
Figure 7B:
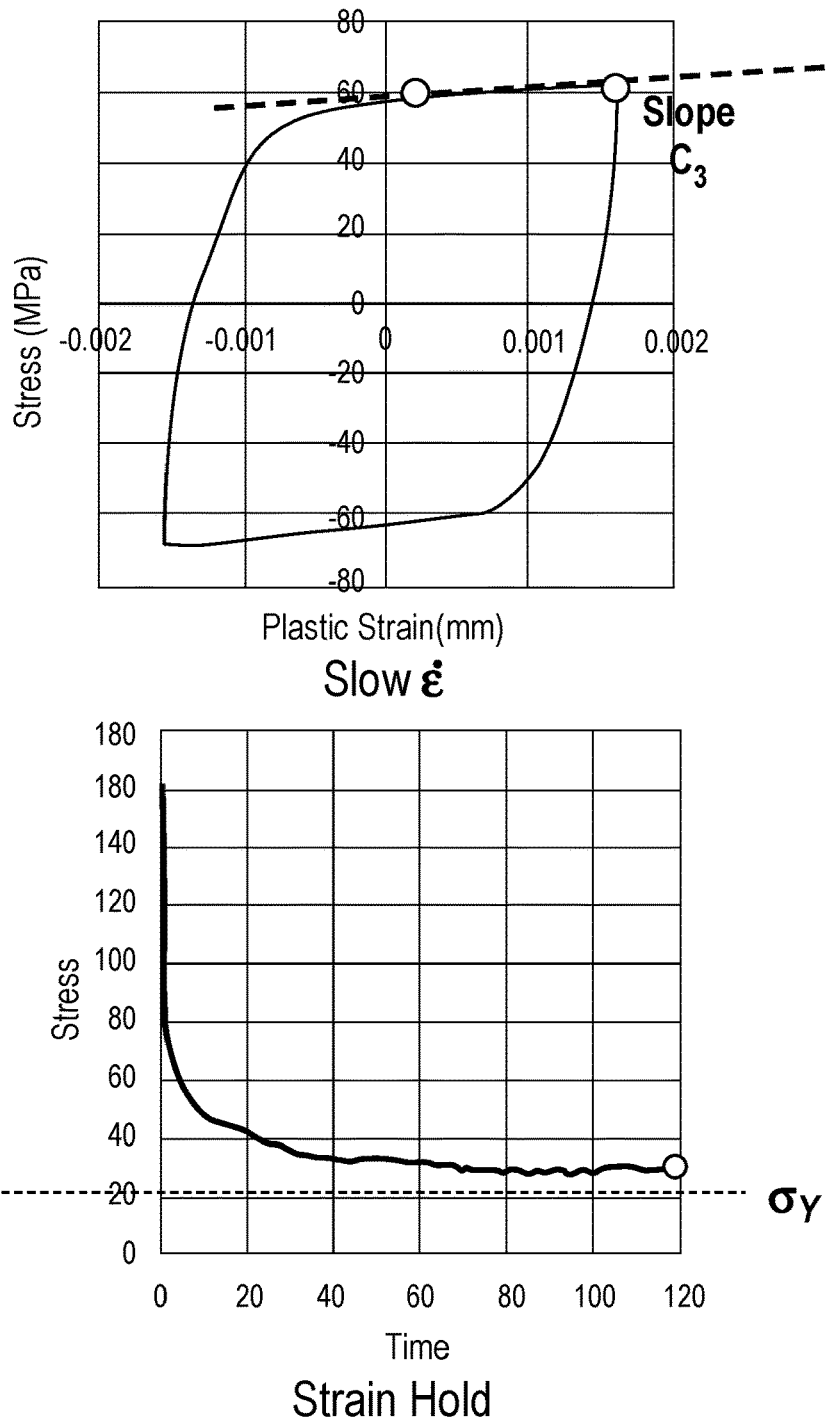
Figure 7D:
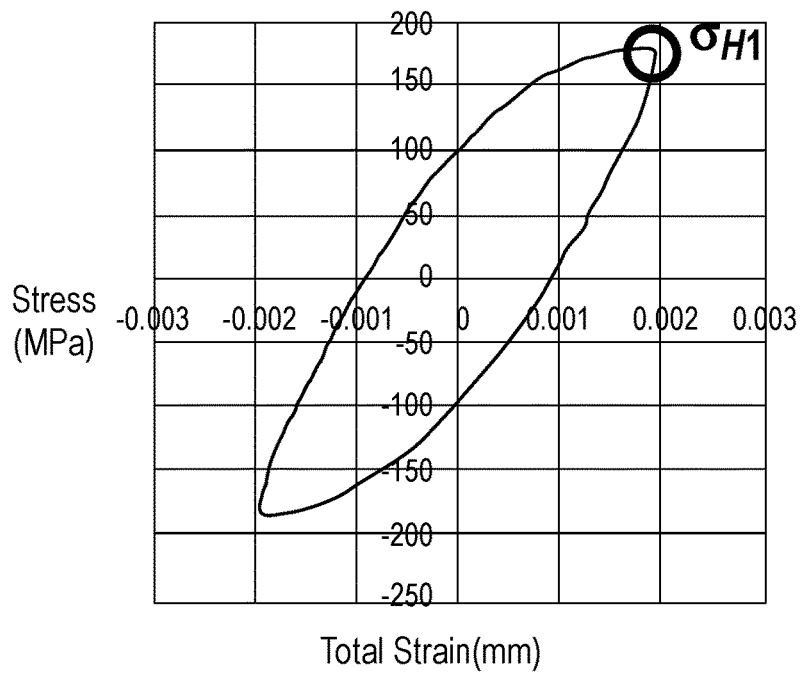
FIG. 7D (three sheets) shows how a portion of operation 401 in FIG. 7A can be performed to calculate some additional material coefficients.
Figure 7D:
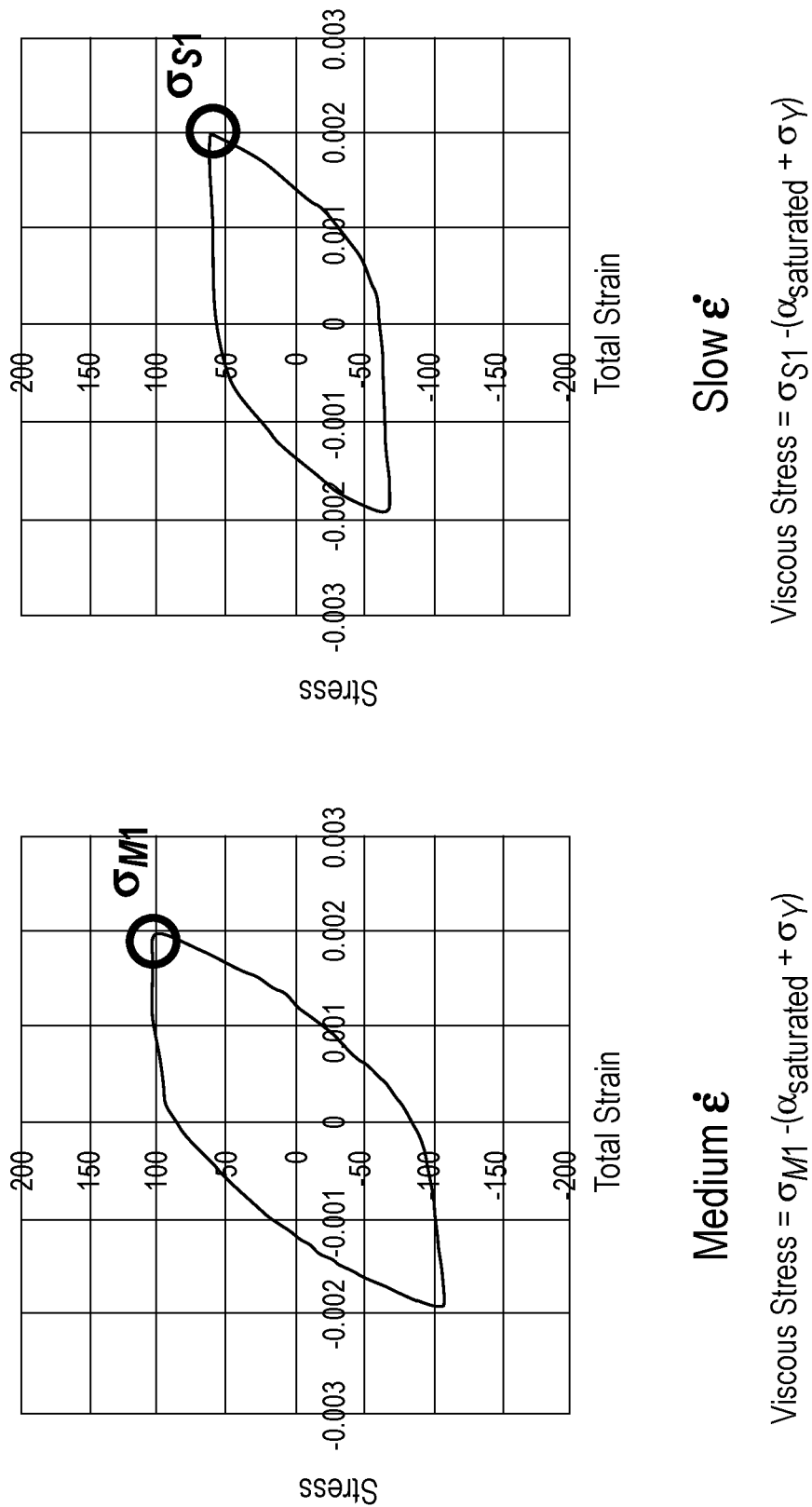
Figure 7D:
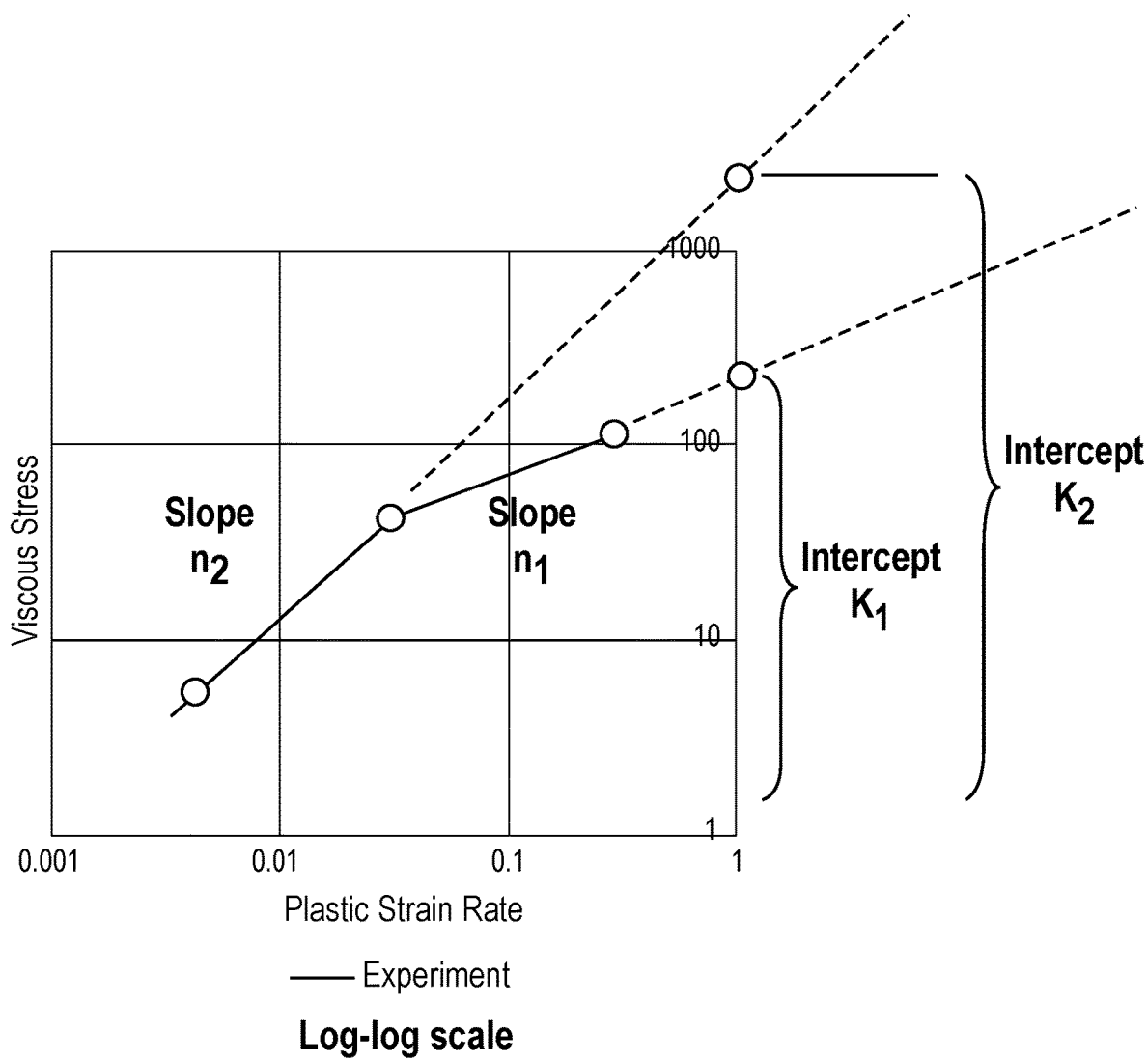
Figure 7E:
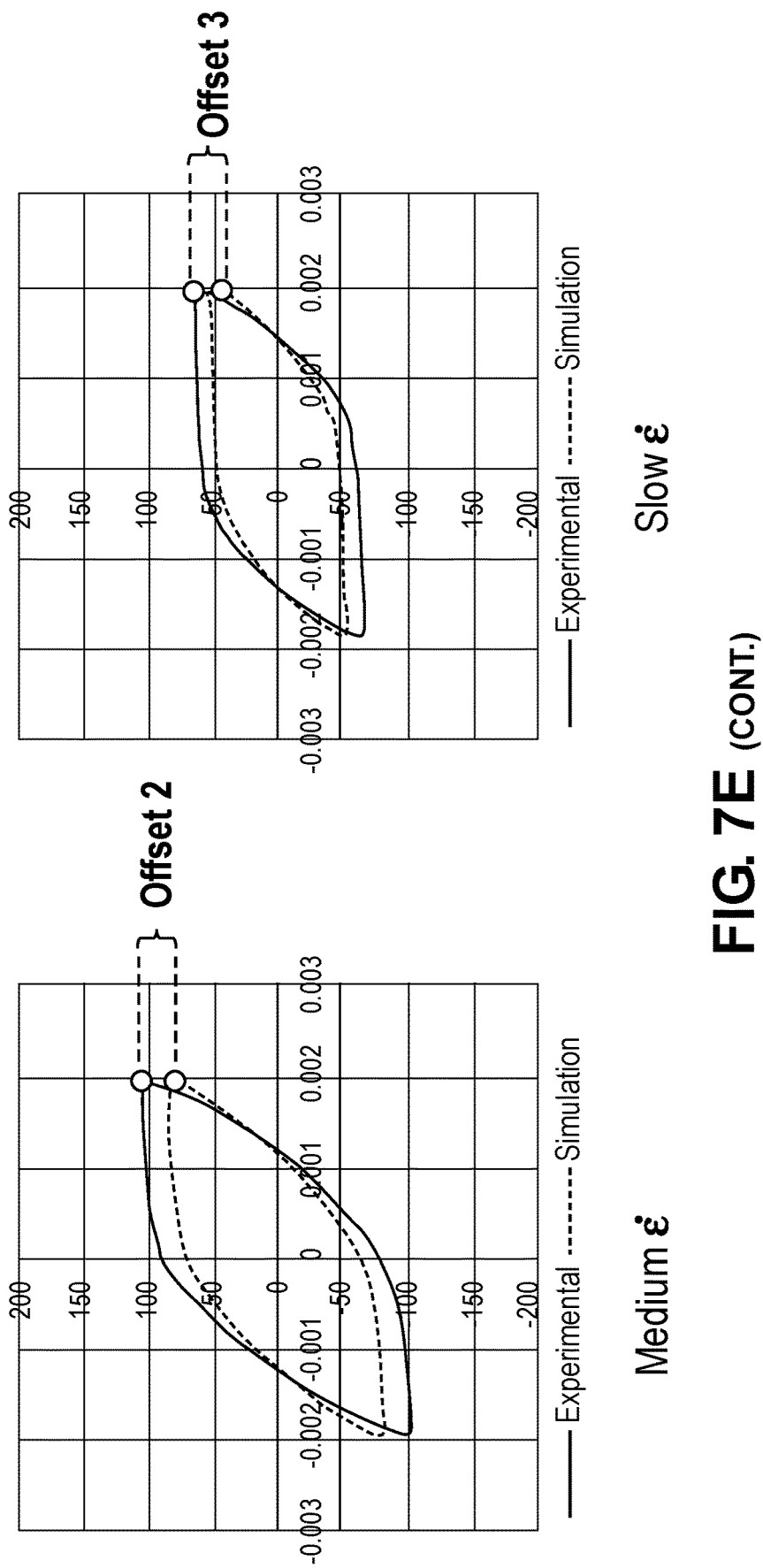
FIG. 7E (three sheets) shows how operation 411 in FIG. 7A can be performed to recalculate some additional material coefficients.
Figure 7E:
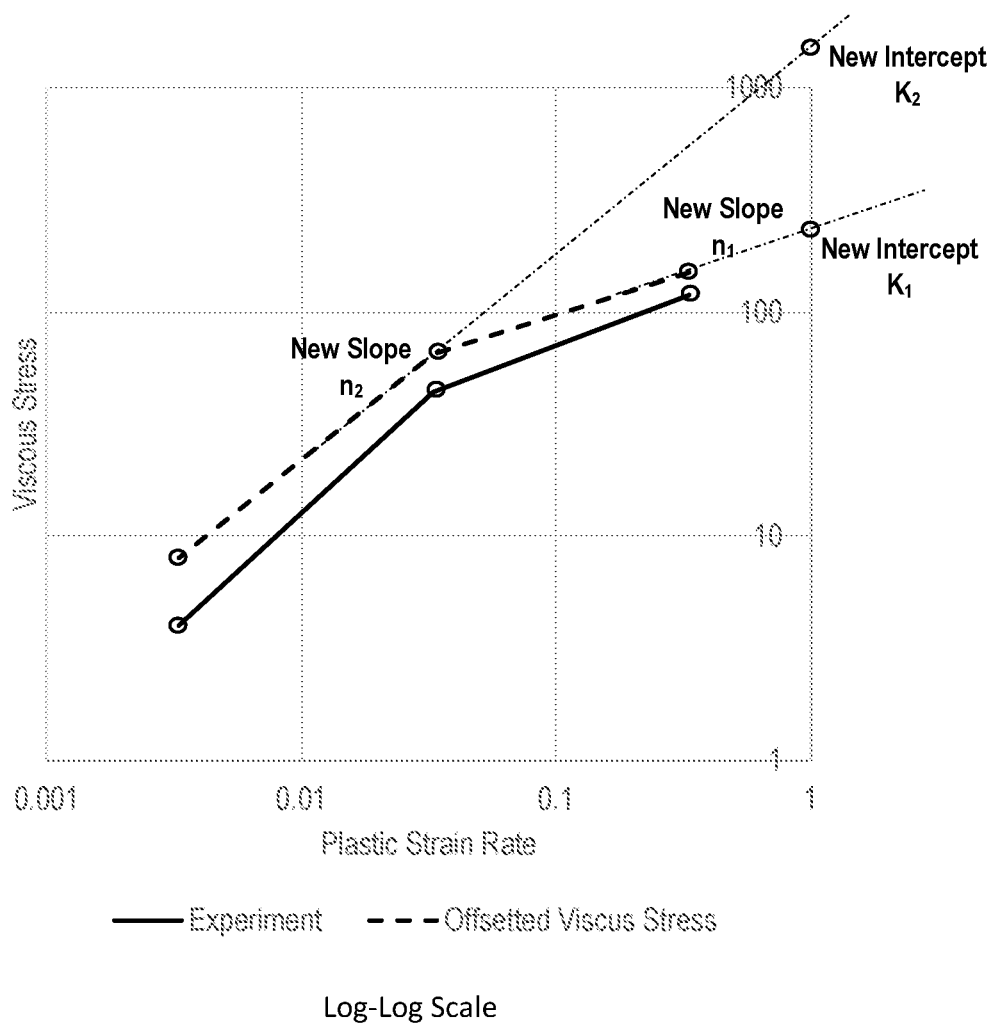
Figure 7F:
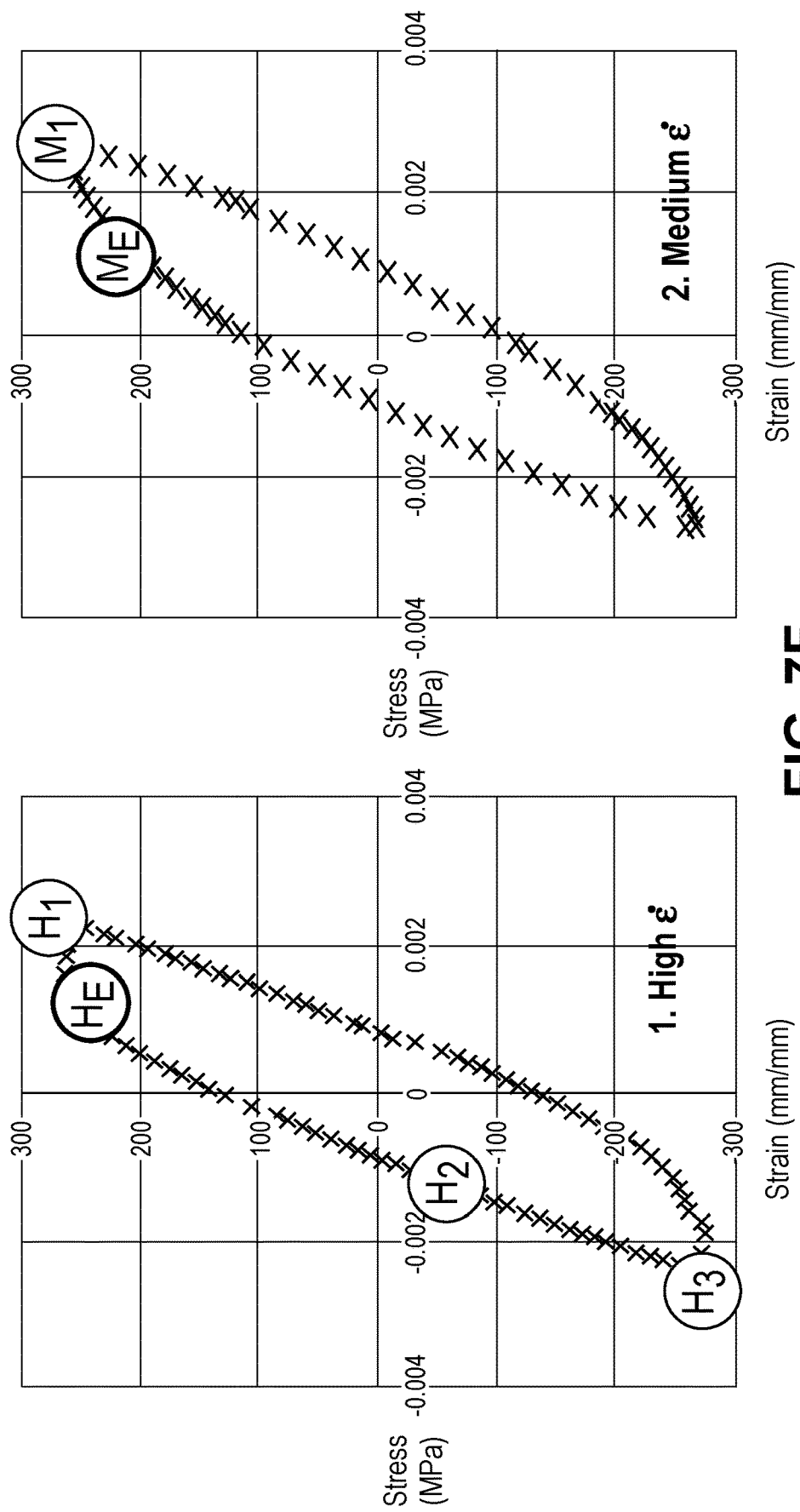
FIG. 7F (two sheets) shows the error calculation points on the experimental data graphs that can be used in one embodiment.
Figure 7F:
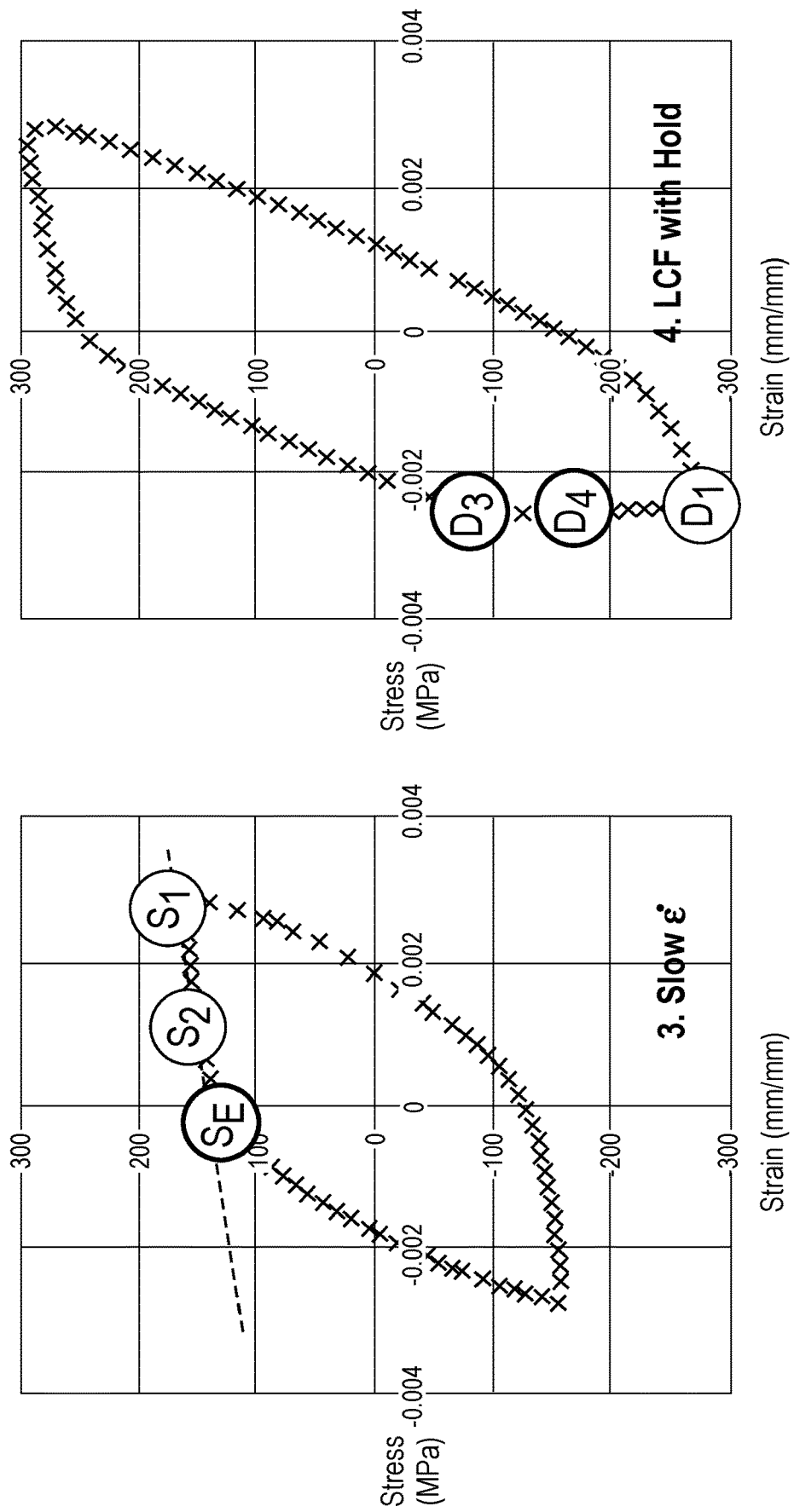

The method shown in FIG. 7A illustrates a more specific method than the method shown in FIGS. 4 and 5. In one embodiment, the method shown in FIG. 7A can be used as an implementation of operations 153 and 155 in FIG. 4. The method shown in FIG. 7A is tailored to the TMF material models shown in FIGS. 6A and 6B; in particular, the method shown in FIG. 7A is designed to work with Hooke's Law for elastic response and Chaboche Kinematic Hardening with static recovery and Exponential Visco hardening for rate dependence models. FIG. 6A shows these three models while FIG. 6B shows the relationship of the material coefficients within each of the models. Referring now to FIG. 7A, in operation 401, a data processing system calculates some parameters directly from characteristics of the test data. This calculation in operation 401 can remove at least three material coefficients from the total set of unknown material coefficients and thus can reduce processing time by the optimization algorithm and also improve the likelihood that a converged optimization solution can be reached. FIG. 7B shows a specific implementation for this portion of operation 401; in this specific implementation, the three parameters can be computed from the fitting of a line to the slope of a curve in the test data to determine the slope of the curve along the line that is fitted to a specific portion of the test curves as shown in FIG. 7B. Also in operation 401, the data processing system calculates for material coefficients with the assumption that there are no KSR affects, and an example of these calculations is shown in FIG. 7D. In operation 403 the data processing system can calculate four more material coefficients using the specified relationships shown in operation 403 in FIG. 7A; FIG. 7C shows a specific implementation of operation 403 to calculate these four more material coefficients. In operation 405, the data processing system assumes the same power for the three KSR terms which assumption works for most alloys. Then in operation 407, the data processing system calculates three more material coefficients based upon an empirical relationship shown in operation 407 of FIG. 7A. Then in operation 409, the data processing system solves to generate the simulation curves and finds errors in the peak stress values with respect to specific points on the experimental graphs which can be similar to the graphs shown in FIGS. 3A, 3B, 3C, and 3D. Operation 409 shown in FIG. 7a can be similar to operation 209 shown in FIG. 5. Then in operation 411, the data processing system can recalculate for of the material coefficients to account for a second material model which can Account for a decrease in stress due to KSR. A specific implementation of operation 411 is shown in FIG. 7E which shows how these four material coefficients are recalculated prior to operation 413. Then in operation 413, the data processing system uses the latest material coefficients, including the recalculated material coefficients from operation 411, to generate new simulation curves. These new simulation curves can then be compared to the test data by calculating errors with respect to the test data in the experimental graphs at specific points such as the specific points identified in operation 413 shown in FIG. 7A and also shown in FIG. 7F. Then in operation 415 the data processing system can determine whether an optimization solution has converged to an optimum fit of the simulation curves to the experimental graphs or experimental data. This optimum fit can be based upon a comparison to a desired error level relative to a threshold value such that if the errors are within a threshold value of the desired error level then the data processing system can determine that an optimization solution has converged. If an optimization solution has converged to an optimum fit then processing can be completed in operation 417. If on the other hand an optimization solution has not converged then processing reverts back to operation 403 to repeat the optimization algorithm by using new optimization variables such as P1, P2 and P3; the optimization algorithm can repeat operations 403, 405, 407, 409, 411, 413 and 415 until the optimization solution converges (or the process times out if no convergence is achieved after a predetermine period of time).

Figure 8:
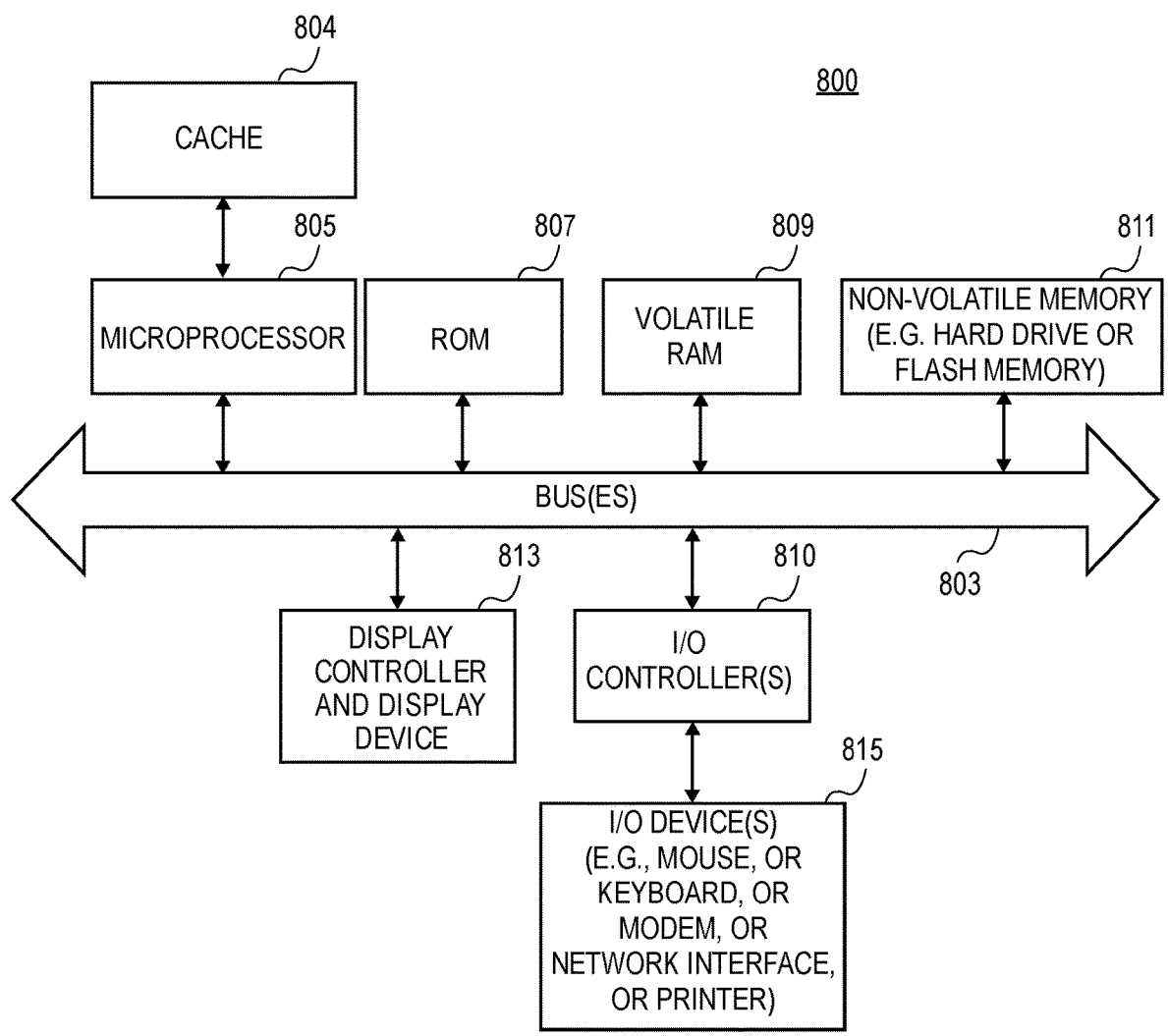
FIG. 8 is an example of a data processing system that can be used to perform or implement one or more of the embodiments described herein.

FIG. 8 shows one example of a data processing system 800, which may be used with one embodiment. For example, the system 800 may be implemented to provide a system that performs one or more of the methods shown in FIGS. 1, 4, 5, and 7A. Note that while FIG. 8 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 8, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811 and execute the instructions to perform operations described above. The microprocessor(s) 805 may contain one or more processing cores. The bus 803 interconnects these various components together and also interconnects these components 805, 807, 809, and 811 to a display controller and display device 813 and to peripheral devices such as input/output (I/O) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 8 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a non-transitory computer readable storage medium, such as, but not limited to, any type of disk including floppy disks, optical disks, CD-ROMs, and magnetic-optical disks, DRAM (volatile), flash memory, read-only memories (ROMs), RAMs, EPROMs, EEPROMs, magnetic or optical cards, or any type of media suitable for storing electronic instructions, and each coupled to a device bus.

A machine readable medium includes any mechanism for storing information in a form readable by a machine (e.g., a computer). For example, a non-transitory machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more non-transitory memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)) and then stored in non-transitory memory (e.g., DRAM or flash memory or both) in the client computer.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A non-transitory machine readable medium storing executable program instructions which when executed by a data processing system cause the data processing system to perform a method, the method comprising:

storing material test data that has been collected from a set of one or more physical measurements of a material, wherein the material has properties characterized by a set of material coefficients;

storing a set of optimization parameters and storing a set of relationships between the set of material coefficients and the set of optimization parameters such that values of the material coefficients in at least a portion of the set of material coefficients can be calculated from the set of optimization parameters according to the set of relationships, wherein the set of relationships includes a relationship between an optimization parameter in the set of optimization parameters and a ratio of Chaboche coefficients in the set of material coefficients, and wherein the set of optimization parameters have fewer parameters than a total number of coefficients in the set of material coefficients;

calculating optimum values of the optimization parameters to yield an optimum fit of the material test data to one or more material models of the material, the one or more material models using values of the set of material coefficients calculated from the calculated optimum values of the optimization parameters;

performing a simulation of a physical object that contains the material using one or more material models to determine behavior of the material in the simulation of the physical object; and generating one or more results based on the simulation, the one or more results indicating a performance of a design of the physical object.

2. The medium as in claim 1 wherein the set of material coefficients comprises a first subset of material coefficients and a second subset of material coefficients, and the second subset of material coefficients is the portion of the set of material coefficients that is calculated from the set of optimization parameters; and wherein the method further comprises:

calculating the first subset of material coefficients from the stored material test data before calculating the optimum values.

3. The medium as in claim 2 wherein the optimum fit is based on a desired error level.

4. The medium as in claim 2, wherein the set of material coefficients calculated from the calculated optimum values of the optimization parameters are used in the simulation to determine the behavior of the material in the simulation of the physical object.

5. The medium as in claim 4 wherein the simulation provides one or more results that indicate one or more of: a performance of the physical object; failure data about the physical object; thermo-mechanical fatigue data about the physical object; or useful life data about the physical object; and wherein the method further comprises:

revising the design of the physical object based on the one or more results.

6. The medium as in claim 2 wherein the method uses specified ranges of possible values for each of the optimization parameters in the set of optimization parameters to allow the set of optimization parameters to work for a variety of different materials.

7. The medium as in claim 2 wherein the optimum values are calculated iteratively in a solver that determines whether a fit is within a threshold value of a desired error level.

8. The medium as in claim 2 wherein the material test data comprises one or more of: low cycle fatigue (LCF) test data for the physical object, or complex LCF (CLCF) test data, or uniaxial test data, or creep test data, or strain hold test data, or TMF test data; and the one or more material models comprise one or more of: a Chaboche Kinematic Hardening model; a Kinematic Static Recovery model; and an Exponential Visco Hardening (Viscoplasticity) model.

9. The medium as in claim 2 wherein the optimum fit is based on errors computed at only selected points of the material test data.

10. The medium as in claim 2 wherein the method further comprises:

modifying some values in the second subset to apply a second material model in calculating the optimum values.

11. A machine implemented method, the method comprising:

storing material test data that has been collected from a set of one or more physical measurements of a material, wherein the material has properties characterized by a set of material coefficients;

storing a set of optimization parameters and storing a set of relationships between the set of material coefficients and the set of optimization parameters such that values of the material coefficients in at least a portion of the set of material coefficients can be calculated from the set of optimization parameters according to the set of relationships, wherein the set of relationships includes a relationship between an optimization parameter in the set of optimization parameters and a ratio of Chaboche coefficients in the set of material coefficients, and wherein the set of optimization parameters have fewer parameters than a total number of coefficients in the set of material coefficients;

calculating optimum values of the optimization parameters to yield an optimum fit of the material test data to one or more material models of the material, the one or more material models using values of the set of material coefficients calculated from the calculated optimum values of the optimization parameters;

performing a simulation of a physical object that contains the material using one or more material models to determine behavior of the material in the simulation of the physical object; and generating one or more results based on the simulation, the one or more results indicating a performance of a design of the physical object.

12. The method as in claim 11 wherein the set of material coefficients comprises a first subset of material coefficients and a second subset of material coefficients, and the second subset of material coefficients is the portion of the set of material coefficients that is calculated from the set of optimization parameters; and wherein the method further comprises:

calculating the first subset of material coefficients from the stored material test data before calculating the optimum values.

13. The method as in claim 12 wherein the optimum fit is based on a desired error level.

14. The method as in claim 12 wherein the set of material coefficients calculated from the calculated optimum values of the optimization parameters are used in the simulation to determine the behavior of the material in the simulation of the physical object.

15. The method as in claim 14 wherein the simulation provides one or more results that indicate one or more of: a performance of the physical object; failure data about the physical test; thermo-mechanical fatigue data about the physical object; or useful life data about the physical object; and wherein the method further comprises:

revising the design of the physical object based on the one or more results.

16. The method as in claim 12 wherein the method uses specified ranges of possible values for each of the optimization parameters in the set of optimization parameters to allow the set of optimization parameters to work for a variety of different materials.

17. The method as in claim 12 wherein the optimum values are calculated iteratively in a solver that determines whether a fit is within a threshold value of a desired error level.

18. The method as in claim 12 wherein the material test data comprises one or more of: low cycle fatigue (LCF) test data for the physical object, or complex LCF (CLCF) test data, or uniaxial test data, or creep test data, or strain hold test data, or TMF test data; and the one or more material models comprise one or more of: a Chaboche Kinematic Hardening model; a Kinematic Static Recovery model; and an Exponential Visco Hardening (Viscoplasticity) model.

19. The method as in claim 12 wherein the optimum fit is based on errors computed at only selected points of the material test data.

20. The method as in claim 12 wherein the method further comprises:

modifying some values in the second subset to apply a second material model in calculating the optimum values.

\* \* \* \* \*